United States Patent [19]

Koyama et al.

[11] Patent Number: 4,884,036

[45] Date of Patent: Nov. 28, 1989

[54] BAND-PASS FILTER

[75] Inventors: Mikio Koyama, Yokohama; Hiroshi Tanimoto, Kawasaki, both of Japan

[73] Assignee: Kabushiki Kaisha Toshiba, Kawasaki, Japan

[21] Appl. No.: 163,843

[22] Filed: Mar. 3, 1988

[30] Foreign Application Priority Data

Mar. 4, 1987 [JP] Japan .................................. 62-47850

[51] Int. Cl.$^4$ .......................... H03K 5/00; H03B 1/00
[52] U.S. Cl. .................................. 328/167; 307/520; 307/521
[58] Field of Search ................ 328/127, 167; 307/240, 307/520, 540, 521; 333/173

[56] References Cited

PUBLICATIONS

"Electronically Tunable Active Filter with Operational Transconductance Amplifiers", IEEE, Transactions on Circuits and Systems, vol. CAS 29, No. 5, May 1982, by Melvar.
"A Mixed LDI—Bilinear Transformation for Biquadratic Switched Capacitor Filters", IEEE, ISCS, May 1982, Mitchael et al.
"Monolithic Filters", IEEE ISSCC, Feb. 1980, Foxall et al.
"Exact Design of Switched—Capacitor Bandpass Filters Using Coupled—Biquad Structures", IEEE Transactions on Circuits and Systems, vol. CAS 27, No. 6, Jun. 1980, Martin et al.
"Sampled Analog Filtering Using Switched Capacitors as Resistor Equivalents", IEEE ISSC, vol. SC—12, No. 6, Dec. 1978, Caves et al.
"Micropower Switched Capacitor Biquadratic Cell", IEEE, JSSC, vol. SC—17, No. 3, Jun. 1982, Krummenacher.
IEEE J. Solid—State, vol. SC—19, pp. 939–948, "High Frequency CMOS Continuous—Time Filters"; P. R. Gragy et al.; 1984.

Primary Examiner—Stanley D. Miller
Assistant Examiner—Richard Roseen
Attorney, Agent, or Firm—Oblon, Spivak, McClelland, Maier & Neustadt

[57] ABSTRACT

A loop circuit of a band-pass filter is constituted by connecting two integrating circuits each including a current source and a capacitor connected to an output terminal of the current source so that an input terminal of one of the integrating circuits is connected to an output terminal of the other and an output terminal of one of the integrating circuits is connected to an input terminal of the other. At least two sets of the loop circuits are used, and these loop circuits are coupled by a capacitor (Ck). Two termination resistors are connected to an output terminal of a start loop circuit and an output terminal of an end loop circuit, respectively. A coupling capacitor is connected to an input terminal of the start loop circuit, and an input signal is input to the start loop circuit through the coupling capacitor. An output signal is output from an output terminal of the end loop circuit.

20 Claims, 25 Drawing Sheets

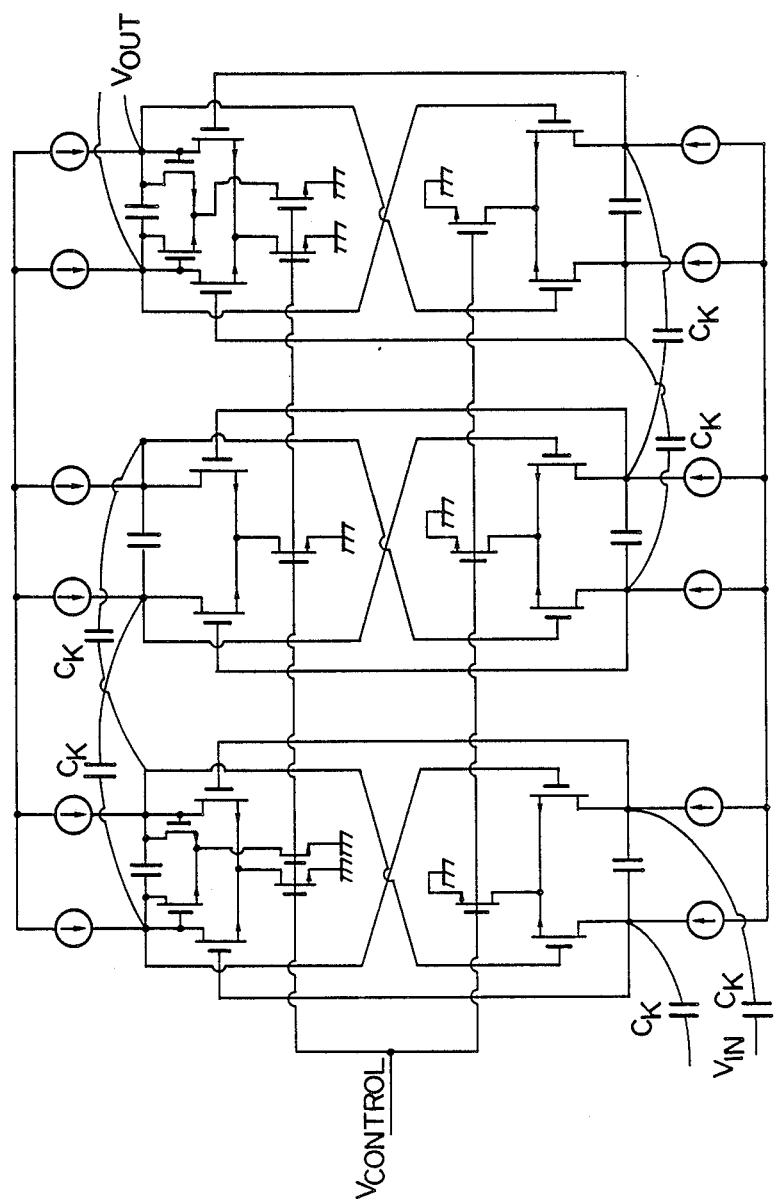
F I G. 3

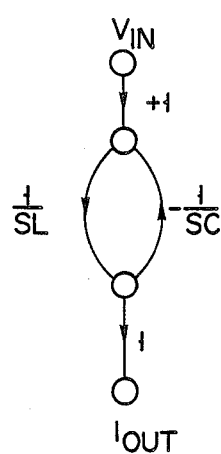
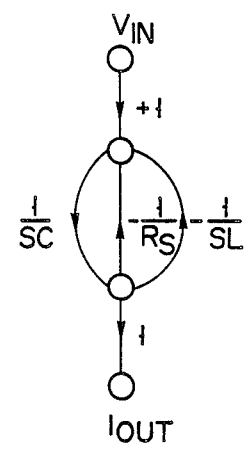
FIG. 17A    FIG. 17B
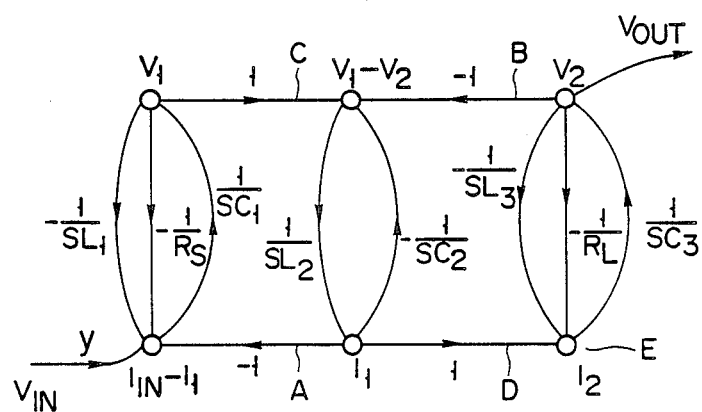
FIG. 18

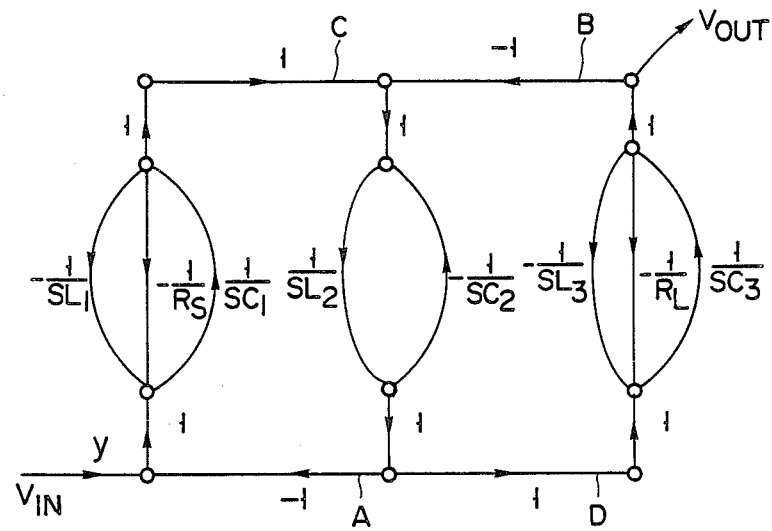
F I G. 19
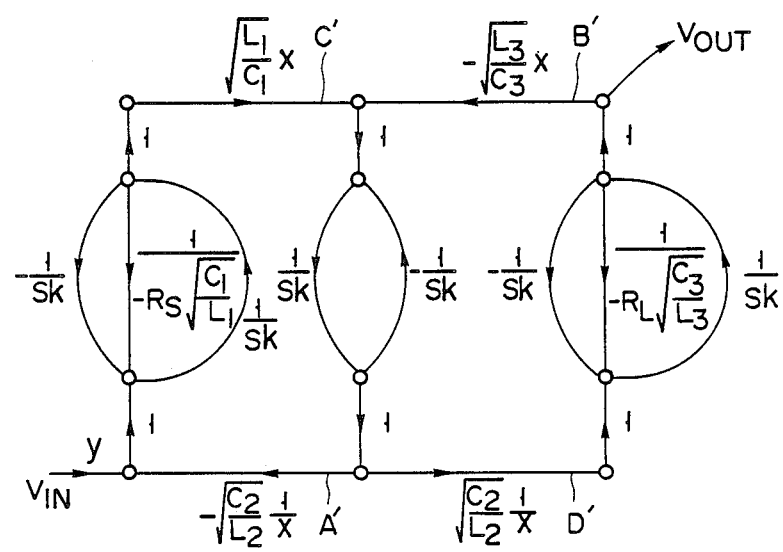
F I G. 20

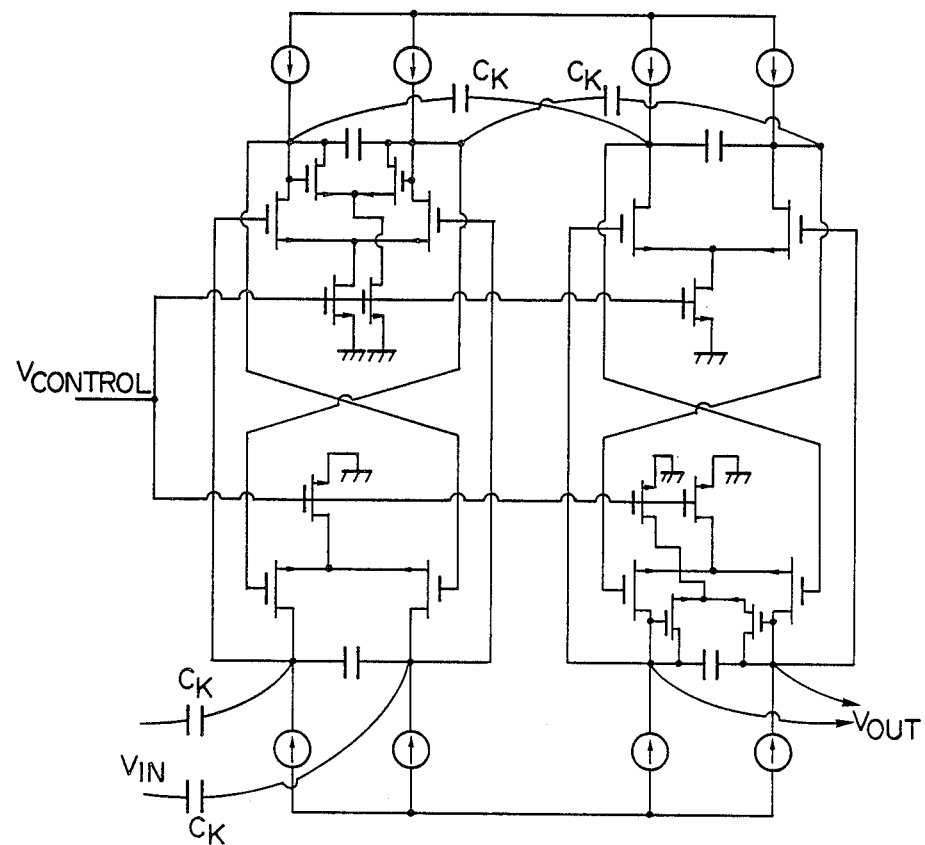
F I G. 33

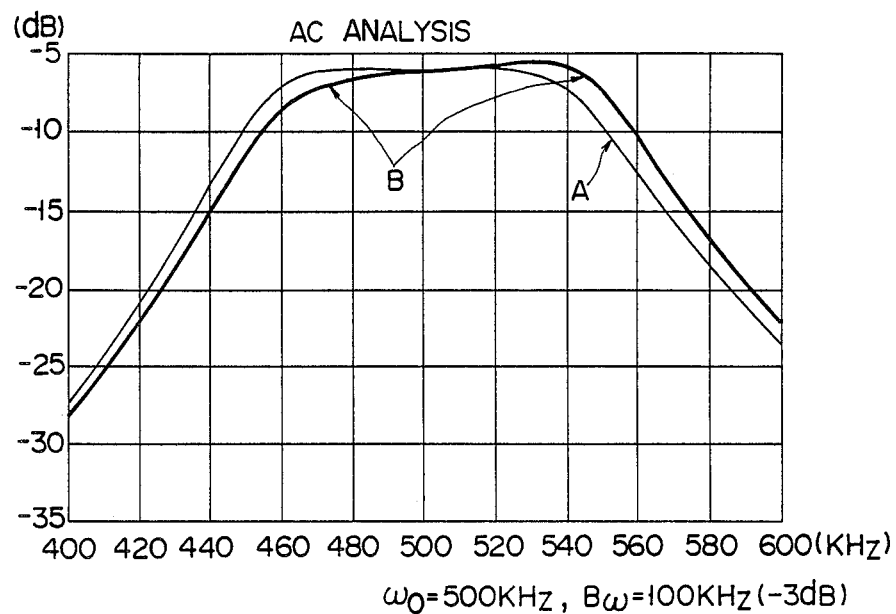
F I G. 47

BAND-PASS FILTER

BACKGROUND OF THE INVENTION

1. Field of the Invention

The present invention relates to a band-pass filter

2. Description of the related art

Recently, a strong demand has arisen for employing a monolithic IC arrangement in various filters A circuit in which a monolithic IC arrangement can be employed must have low element sensitivity and a simple circuit arrangement as possible.

An example of filters designed to satisfy the above requirements is a leap frog type band-pass filter by Paul R. Gray et al. This filter is described in IEEE JOURNAL OF SOLID-STATE CIRCUITS, VOL SC-19, No. 6, DECEMBER 1984, "High-Frequency CMOS Continuous-Time Filters" (PP. 939-949).

This circuit is based on a ladder type LC filter having low element sensitivity, i.e., not easily adversely affected by variations in element characteristics. Therefore, since relative accuracy between elements can be increased if an IC arrangement is employed in a circuit constituted by elements of the same size, scaling can be performed in a relationship between L and C so that time constants of all integrating circuits can be equalized. In addition, according to this method, a filter can be advantageously constituted by only capacitive-coupling of the integrating circuit loops without using any adders and any buffer circuits.

However, the characteristics of the above circuit are not completely theoretical. This is because an operation without strictness such as narrow band approximation is performed, regardless of the above merits. For this reason, pass band characteristics are disturbed, and especially in a wide band filter, desired characteristics cannot be obtained, thereby posing a serious problem. This is because modifications including the narrow band approximation in which transfer characteristics do not strictly coincide with those of the original LC filter are performed at several portions.

SUMMARY OF THE INVENTION

The present invention has been made in consideration of the above situation and has as its object to design a filter without using approximation and provide a band-pass filter having so-called theoretical pass band characteristics without disturbance.

The band-pass filter includes a start loop circuit having a start input terminal and a start output terminal, an end loop circuit having an end input terminal and an end output terminal, a start coupling capacitor connected to the start input terminal, a start termination resistor connected to the start output terminal, and an end termination resistor connected to the end output terminal. An input signal is input to the start loop circuit through the start coupling capacitor, and an output signal is output from the end output terminal.

The start loop circuit comprises a first start current source, an input terminal of which is connected to the start input terminal and an output terminal of which is connected to the start output terminal, a second start current source, an input terminal of which is connected to the start output terminal and an output terminal of which is connected to the start input terminal, a first start capacitor connected to the start input terminal, and a second start capacitor connected to the start output terminal. The second start current source and the first start capacitor constitute one integrating circuit, and the first start current source and the second start capacitor constitute the other integrating circuit.

The end loop circuit comprises a first end current source, an input terminal of which is connected to the end input terminal and an output terminal of which is connected to the end output terminal, a second end current source, an input terminal of which is connected to the end output terminal and an output terminal of which is connected to the end input terminal, a first end capacitor connected to the end input terminal, and a second end capacitor connected to the end output terminal. The second end current source and the first end capacitor constitute one integrating circuit, and the first end current source and the second end capacitor constitute the other integrating circuit.

An end coupling capacitor is coupled to the start output terminal and the end input terminal. All the first and second start and end current sources are voltage-controlled current sources. The first and second start current sources have substantially the same transconductance and the first and second end current sources have substantially the same transconductance.

The start and end coupling capacitors have the same capacity, and the first and second start capacitors and the first and second end capacitors have the same capacity.

According to the present invention, a filter having low element sensitivity can be designed with a very simple circuit without approximation. That is, a wide-band band-pass filter can be constituted in a conventional filter.

Moreover, since time constants of all integrating circuits are equalized, very high relative accuracy of the time constants can be obtained when the circuits are incorporated in an IC. Therefore, An excellent band-pass filter as an IC-incorporating filter can be realized.

BRIEF DESCRIPTION OF THE DRAWINGS

FIG. 3 is a detailed circuit diagram of the embodiment in FIG. 1;

FIGS. 17A to 24 are signal flow graphs for explaining the embodiment of the present invention;

FIG. 33 is a detailed circuit diagram of the embodiment in FIG. 31;

FIG. 47 is a graph for comparing characteristics of the band-pass filter according to the present invention and the conventional band-pass filter.

DETAILED DESCRIPTION OF THE PREFERRED EMBODIMENTS

A band-pass filter according to the present invention will be described below with reference to the accompanying drawings.

First, in order to clarify a difference between the present invention and the reference cited above, a method of designing the circuit described in the above reference will be described in detail below.

Figure 16A:
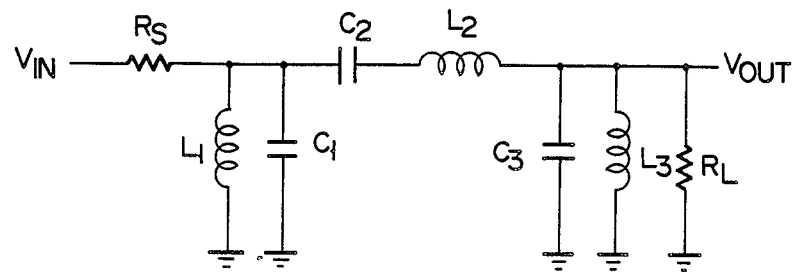
FIGS. 16A to 16C are circuit diagrams for explaining a sextic ladder type LC band-pass filter.
Figure 25:
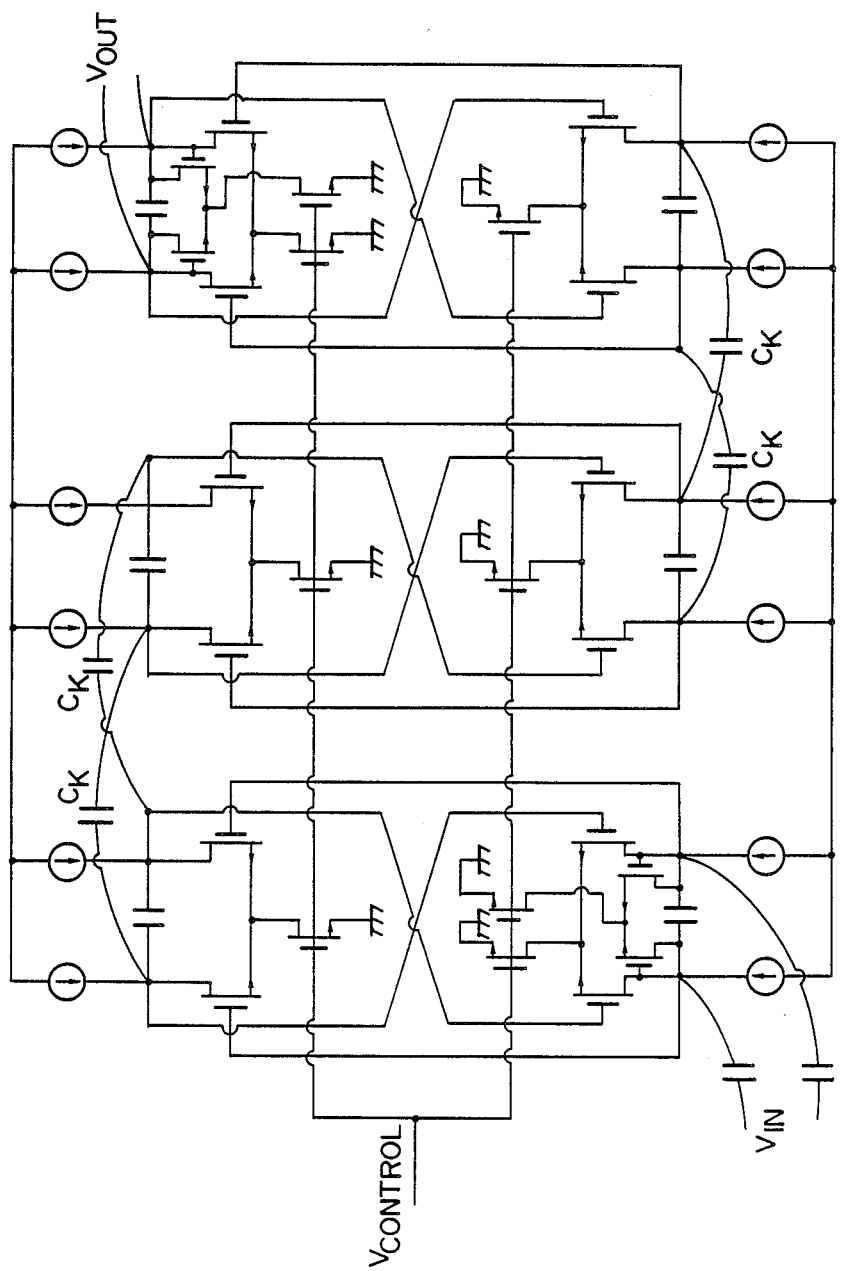
FIG. 25 is a circuit diagram of a conventional band-pass filter.

FIG. 16A shows a sextic ladder type band-pass filter. This filter is known for its low element sensitivity. FIG. 25 shows a filter constituted by active elements on the basis of the above filter. In this filter, each pair of elements L and C shown in FIG. 16A corresponds to an integrating circuit, these integrating circuits are connected through capacitors CK, and capacitors CK transmit signals between the integrating circuits. Each integrating circuit incorporates a capacitance required for integration, and a voltage of a control terminal (Vcontrol) is controlled, thereby controlling filter characteristics with respect to variations in elements. In addition, since the integrating circuit is not of an operational amplifier type but of a differential amplifier type having good frequency characteristics, a high-frequency operation is achieved. This is because, if an operational amplifier is used, a gain is increased but a frequency band is narrowed. A differential amplifier has completely symmetric differential input and output, and frequency characteristics are improved by removing unnecessary poles.

As described above, when an IC is constituted by elements having the same size on the basis of the ladder type LC filter having low element sensitivity, relative accuracy between the elements can be increased. For this reason, this filter can be subjected to scaling with respect to the L and C so that time constants of all the integrating circuits can be equalized. According to this method, the filter can be advantageously constituted by only capacitive-coupling of the integrating circuit loops without an adder and a buffer circuit.

Circuit analysis will be described below with reference to signal flow graphs.

First, currents and voltages at nodes shown in FIG. 16A are represented in a signal flow graph, and integrating elements therein are constituted by active elements. As a result, the arrangement of FIG. 16A can be rewritten as that shown in FIG. 16B.

Figure 16B:
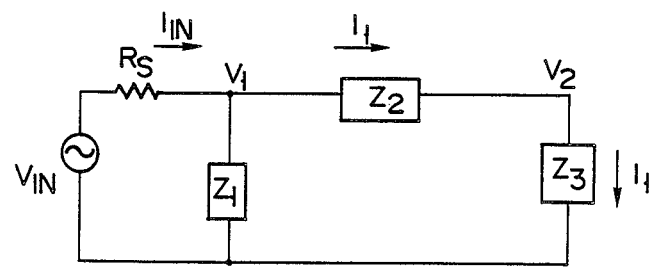

Then, assume in FIG. 16A that an impedance of parallel-connected $L_1$ and $C_1$ is $Z_1$, an impedance of series-connected $L_2$ and $C_2$ is $Z_2$, and an impedance of parallel-connected $L_3$, $C_3$, and $R_L$ is $Z_3$ FIG. 16A is rewritten as FIG. 16B. Impedances $Z_1$, $Z_2$, and $Z_3$ are represented as follows:

$$Z_1 = \{SL_1 \times (1/SC_1)\}/\{SL_1 + (1/SC_1)\}$$
$$Z_2 = SL_2 + (1/SC_2)$$
$$Z_3 = (S/C_3)/\{S^2 + (S/R_LC_3) + (1/L_3C_3)\}$$

Node equations of the circuit shown in FIG. 16B are obtained as follows using $Z_1$, $Z_2$, and $Z_3$:

$$V_{IN} - I_{IN} \cdot Rs = V_1 \tag{1}$$
$$I_{IN} - I_1 = V_1 \times (1/Z_1) \tag{2}$$
$$V_1 - V_2 = I_1 \cdot Z_2 \tag{3}$$
$$I_1 = V_2/Z_3 \tag{4}$$

Equation (1) is substituted for equation (2) to obtain:

$$(V_{IN}/Rs) - i_1 = V_1\{(1/Z_1) + (1/Rs)\} \tag{2'}$$

Figure 16C:
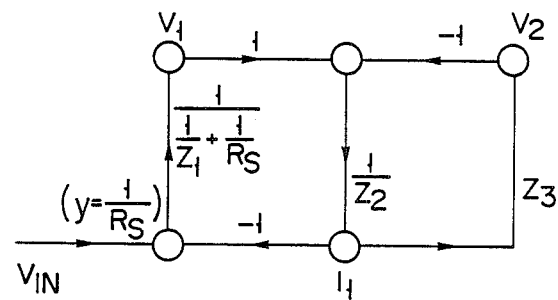

A signal flow graph of equations (2)', (3), and (4) is shown in FIG. 16C (y=1/Rs hereinafter).

In this case, since Rs, $L_1$, and $C_1$ are parallel-connected, $1/\{(1/Z_1)+(1/Rs)\}$ can be represented by:

$$1/\{(1/Z_1) + (1/Zs)\} = (S/C_1)/\{S^2 + (S/RsC_1) + (1/L_1C_1)\}$$

or, $$1/Z_2 = (S/L_2)/\{S^2 + (1/L_2C_2)\}$$

Since $Z_1$, $Z_2$, and $Z_3$ are given as quadratic functions, it is obvious that they can be constituted by integrating circuits.

A signal flow graph of $1/Z_2$ in FIG. 16C corresponds to FIG. 17A, and that of $Z_1$ or $Z_3$ corresponds to FIG. 17B. When the signal flow graph of FIG. 16C is rewritten using those of FIGS. 17A and 17B, a signal flow graph of FIG. 18 is obtained. In FIG. 18, node E which is not present in the signal flow graph of FIG. 16D is additionally provided. For this reason, branch D appears by a coefficient of 1.

In FIG. 18, scaling is performed so that time constants of six integrating circuits are equalized and a signal is transmitted by capacitive coupling. In addition, transmittances of branches A to D of FIG. 18 are equalized. As a result, FIG. 18 corresponds to the circuit shown in FIG. 25.

Then, the signal flow graph of FIG. 18 is modified to generate branches of a coefficient of 1. As a result, a signal flow graph is obtained as shown in FIG. 19.

In consideration of an axially symmetrical circuit, assume that $\sqrt{L_1C_1}=\sqrt{L_2C_2}=\sqrt{L_3C_3}=k$, $L_1=L_3$, and $C_1=C_3$. In this manner, scaling of three loops will be taken into consideration.

When time constants of the integrating circuits are equalized in consideration of a transfer function of each loop, coefficients of branches A' to D' are obtained as $-\sqrt{C_2/L_2}, -\sqrt{L_3/C_3}, \sqrt{L_1/C_1}$, and $\sqrt{C_2/L_2}$, respectively, as shown in Fig 20. In this case, a value of Rs is $Rs\sqrt{C_1/L_1}$, and that of $R_L$ is $RL\sqrt{C_3/L_3}$.

Then, scaling of termination resistors Rs and RL is performed in order to equalize the upper and lower branches. Assuming that Rs is Rs.x and RL is $R_L$.x, a capacitance is reduced by 1/x, and an inductance is increased x times. Therefore, in order to equalize absolute values of branches A' and C' and those of branches B' and D' shown in FIG. 20:

$$\sqrt{L_1/C_1} \times x = \sqrt{C_2/L_2} \times (1/x)$$

In this case, x is obtained as follows:

$$x = \sqrt[4]{(C_2/L_2) \times (C_1/L_1)}$$

Since the filter is assumed to be symmetrical as described above:

$$L_1 = L_3, C_1 = C_3$$

Therefore, absolute values of branches A' to D' are obtained as $\sqrt[4]{(C_2/L_2) \times (L_1/C_1)}$. Assuming that this value is $\gamma$, a signal flow graph shown in FIG. 21 is obtained.

Figure 21:
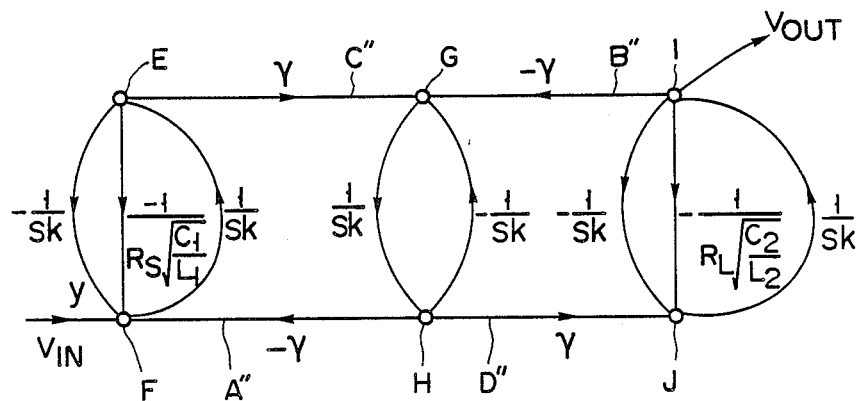

In the above reference (IEEE JOURNAL OF SOLID-STATE CIRCUITS), branch A" of transmittance of $-\gamma$ shown in FIG. 21 is moved between nodes E and G where branch C" is present to cause branch A" to serve as a bidirectional branch. Similarly, branch B" is moved between nodes H and J where branch D" is present to cause branch B" to serve as a bidirectional branch. For this reason, a route of $$G \to (1/sk) \to H \to (-\gamma) \to F \to (1/sk) \to E$$

shown in FIG. 21 is changed as follows (FIG. 22):

$$G \to (-\gamma/s^2k^2) \to E$$

Figure 22:
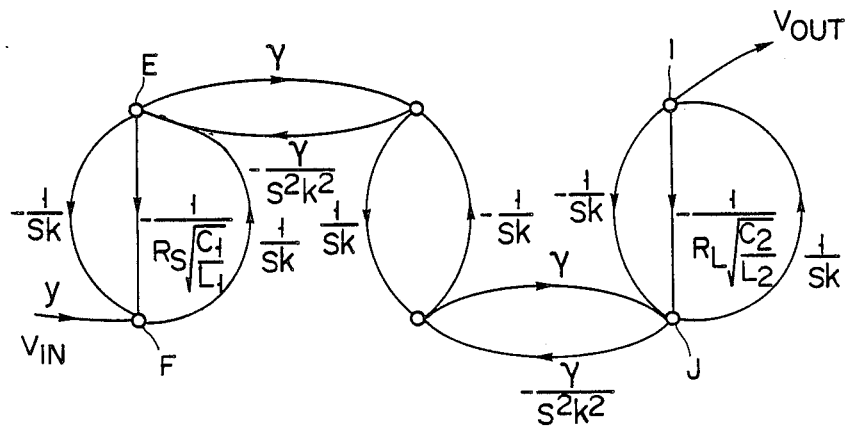
Figure 23:
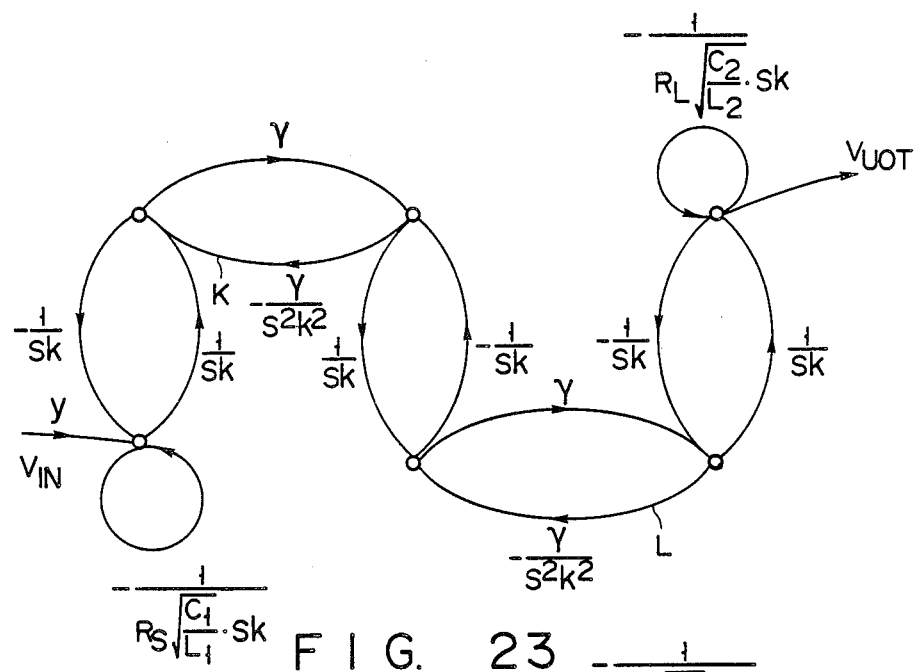

Subsequently, branches E→F and I→J of FIG. 22 are moved as shown in FIG. 23.

Since the branches are moved as described above, a transmittance of branches K and L is changed from constant $\gamma$ to coefficient $(1/S^2k^2)$, i.e., the transmittance is no longer a constant.

For this reason, approximation is performed in the reference cited above in the following manner. That is, when a frequency is close to center frequency $\omega_0$ of the band-pass filter, approximation is established as follows:

$$|1/s^2k^2| = |\omega_0^2/s^2| \approx 1$$

Figure 24:
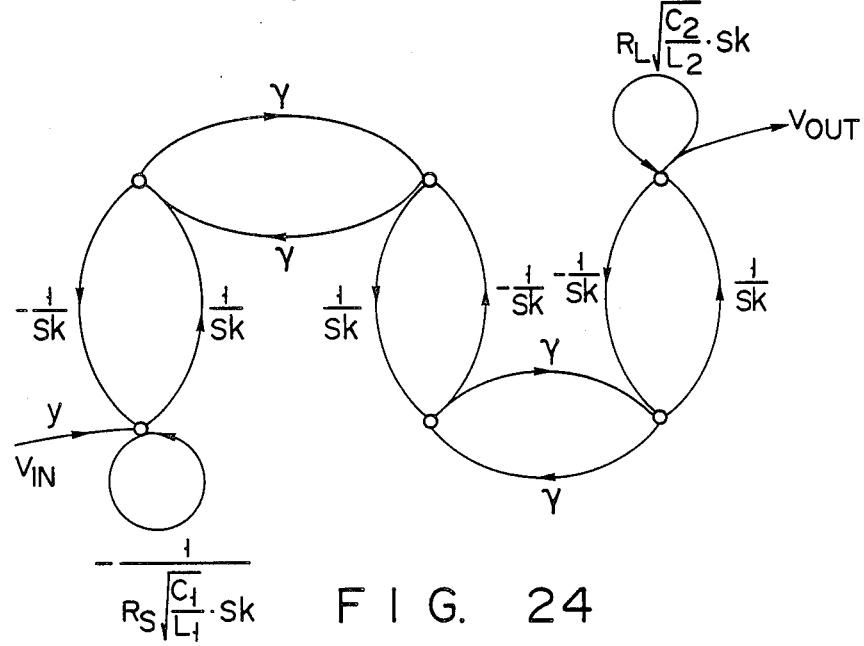

Therefore, so-called narrow band approximation is performed first. Then, a value of branches K and L is substituted by $$(-\gamma/s^2k^2) = \gamma,$$

thereby performing approximation for reversing a plus/minus sign of the transmittance. As a result, a signal flow graph shown in FIG. 24 is obtained.

FIG. 25 shows a circuit arrangement of a band-pass filter designed on the basis of the above signal flow graph. In FIG. 25, however, since transistors are arranged as a differential amplifier, it is difficult to immediately recognize the correspondence. Therefore, a circuit arrangement of FIG. 26 is obtained by rewriting the arrangement shown in FIG. 25 using voltage-controlled current sources.

As described above, in the above reference, narrow band approximation is performed first in order to eliminate coefficient $(1/s^2k^2)$ of the transmittance of branches K and L.

In addition to the first approximation operation, operations without accuracy are performed at two positions in the above reference. The two positions will be clearly pointed out below.

Figure 26:
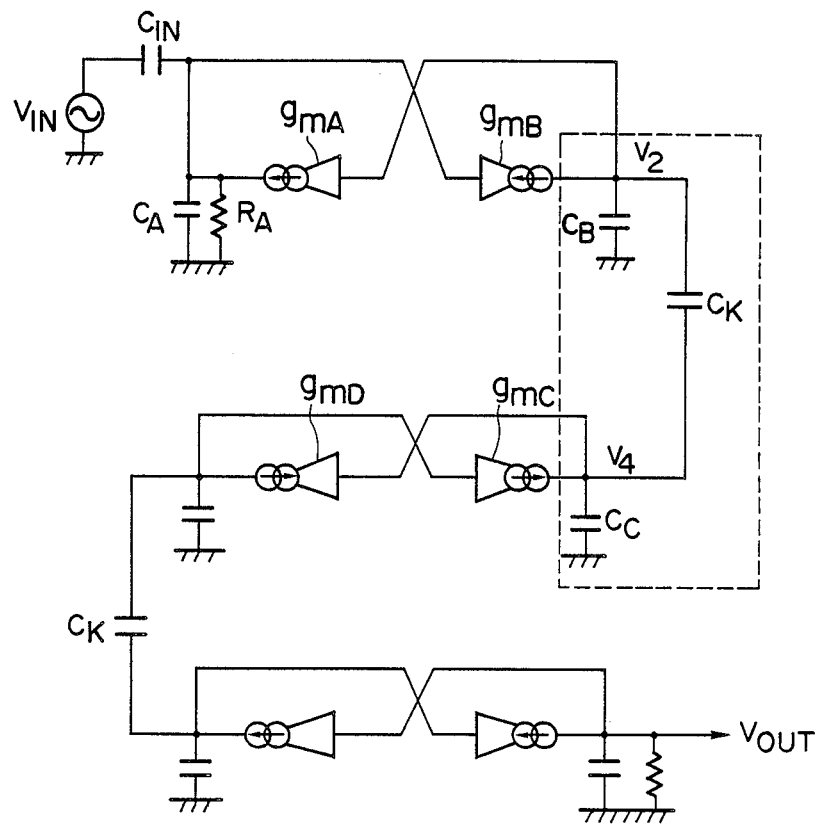
FIG. 26 is a circuit diagram of a conventional band-pass filter.

First, a $\pi$ circuit constituted by capacitors ($C_B$, $C_k$, and $C_c$ surrounded by a dotted line) in FIG. 26 will be taken into consideration. This portion is clearly shown in FIG. 27. Since scaling is performed so that time constants of all the integrating circuits are equalized, $C_B = C_c$ (=C hereinafter) is obtained. Reference symbols $i_1$ and $i_2$ denote output currents of voltage-controlled current sources $g_{mB}$ and $g_{mC}$, respectively. At this time, $V_2$ and $V_4$ are obtained as follows in accordance with a principle of superposition:

$$V_2 = 1/sC[\{C_k/(C + C_k)\} + 1] \times [i_1 + \{C_k/(C + C_k)\}i_2] \quad (5)$$

$$V_4 = 1/sC[\{C_k/(C + C_k)\} + 1] \times [i_2 + \{C_k/(C + C_k)\}i_1] \quad (6)$$

Figure 28:
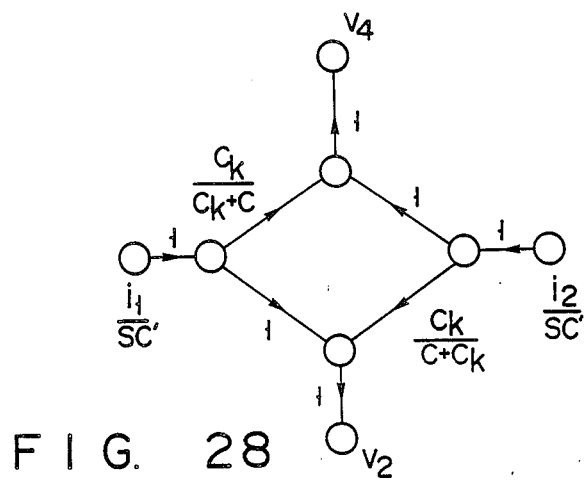
FIGS. 28 to 30 are signal flow graphs for explaining the embodiment of the present invention.
Figure 29:
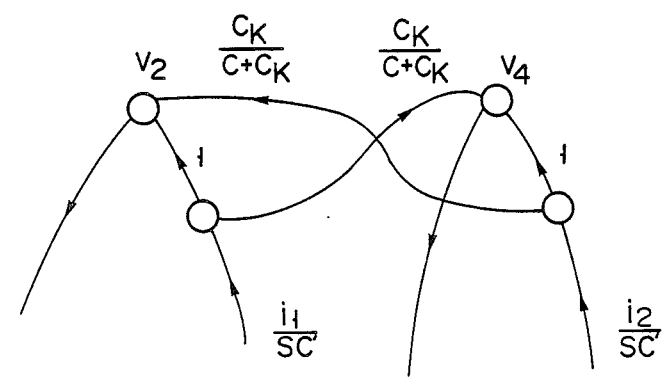

FIG. 28 is a signal flow graph obtained by equations (5) and (6). FIG. 29 is obtained by rewriting FIG. 28 in correspondence with FIG. 23. In FIG. 29, assume that:

$$C' = C\{C_k/(C+C_k)+1\}$$

As is apparent from FIG. 29, the circuit in FIG. 28 does not correspond to that in FIG. 29 by simply moving branches to be bidirectional as in FIG. 23. That is, the branches cannot be bidirectional as in FIG. 23. For this reason, branches must be generated from intermediate portions of the other branches as shown in FIG. 29. This is because approximation and operations without strictness (inaccuracy) are performed when the signal flow graph shown in FIG. 24 is transformed into the circuit shown in FIG. 26. This is the second problem.

In FIG. 26, power source voltage $V_{IN}$ is capacitively divided in a ratio of $C_{IN}$:$C_A$. However, since resistor $R_A$ exists, capacitive-division cannot be performed strictly in accordance with this ratio, i.e., a voltage ratio varies in accordance with a frequency. That is, because of the presence of resistor $R_A$, the circuit shown in FIG. 26 does not strictly represent the signal flow graph of FIG. 24. According to such a design technique, characteristics are disturbed. Especially in a wide band filter, pass band characteristics are greatly disturbed.

Actually, band characteristics of both pass and rejection bands of a filter designed in accordance with the circuit of FIG. 26 do not coincide with those of the original LC filter as shown in FIG. 47. That is, an axis in the center frequency ($\omega_0$) is inclined to the left as a whole.

As described above, in the above design, the first, second, and third modifications include narrow band approximation whose transmission characteristics do not strictly coincide with those of the original LC filter.

A band-pass filter according to the present invention which can be obtained by a method not employing the above modifications will be described below.

An operation in which a signal flow graph is modified without approximation so that transfer characteristics of the original filter are preserved will be described. An embodiment of a band-pass filter according to the present invention will be described with reference to a specific method.

Figure 5:
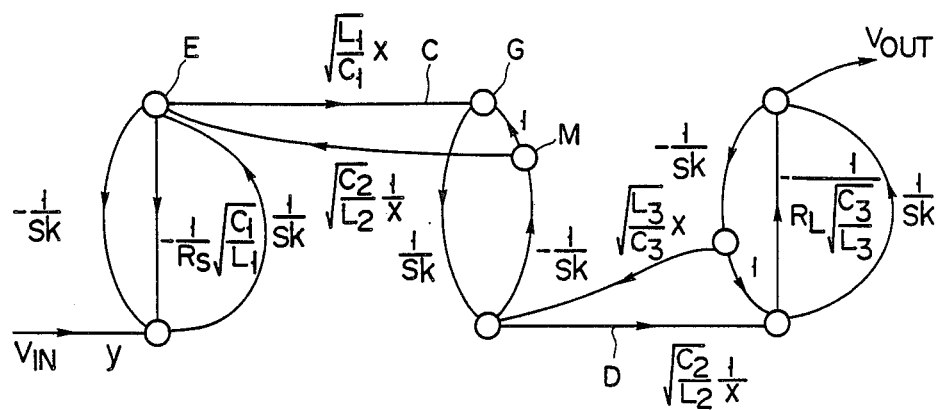
FIGS. 5 to 7 are signal flow graphs for explaining the embodiment of the present invention.
Figure 30:
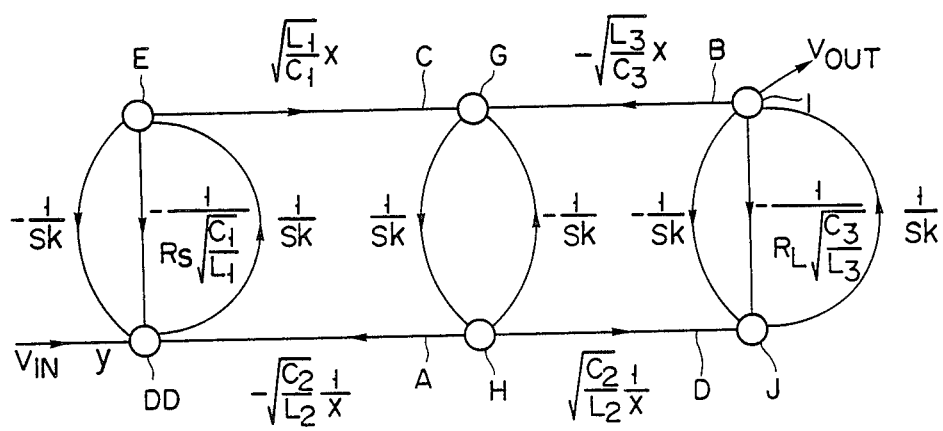

First, in FIG. 30 which shows the same signal flow graph as shown in FIG. 21, branches A and B are moved without approximation. Routes H→DD→E and I→G→H are moved as H→G→E and I→J→H, respectively. Since the routes are moved without approximation, characteristics of the original circuit are preserved. At this time, a signal flow graph is obtained as shown in FIG. 5. In FIG. 5, however, the moved branches are not bidirectional, and branches having the following transmittance extend from intermediate portions of the moved branches:

$$\sqrt{(C_2/L_2)} \times (1/x)$$

Figure 6:
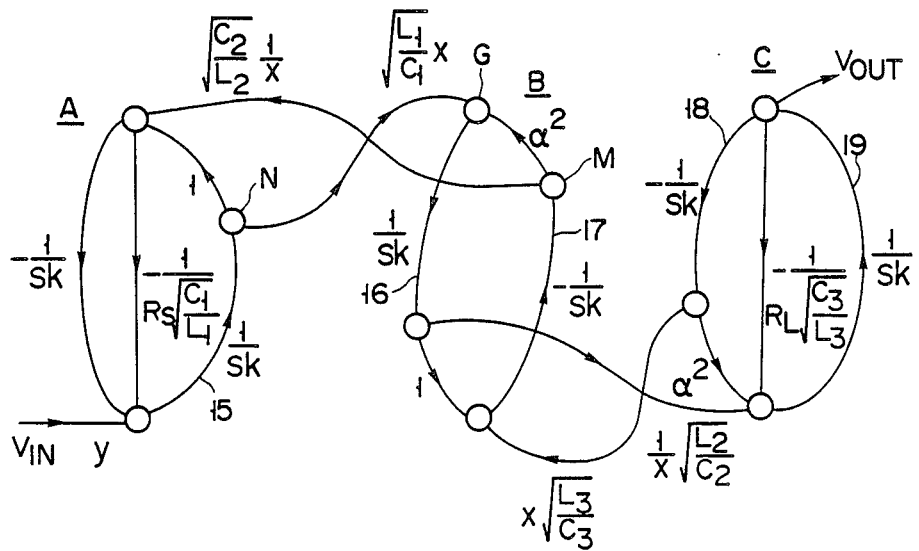

Similarly, branches C and D are moved. Branches C and D must extend from their intermediate portions so that a bidirectional branch $\gamma$ corresponds to a capacitive $\pi$ circuit. When branch C is moved between nodes N and G as shown in FIG. 6, the transmittance of M→E→G in FIG. 5 disappears. Therefore, a branch of M→G must be added as shown in FIG. 6. In this case, note that:

$$\alpha^2 = 1 + \gamma^2 = 1 + \sqrt{(C_2/L_2)}\sqrt{(L_1/C_1)}$$
$$= 1 + \sqrt{(L_3/C_3)}\sqrt{(C_2/L_2)}$$

Similarly, branch D is moved. FIG. 6 is a signal flow graph obtained after movement. As a result, the signal flow graph of FIG. 6 corresponds to that of FIG. 29, and a complete correspondence with respect to the capacitive $\pi$ circuit shown in FIG. 27 can be obtained.

With this movement, however, a resonant frequency of loops B and C of three loops A, B, and C shown in FIG. 6 is obtained as follow:

$\omega_0 \cdot \alpha$ ($\omega_0$; a center frequency of the band-pass filter)

Figure 7:
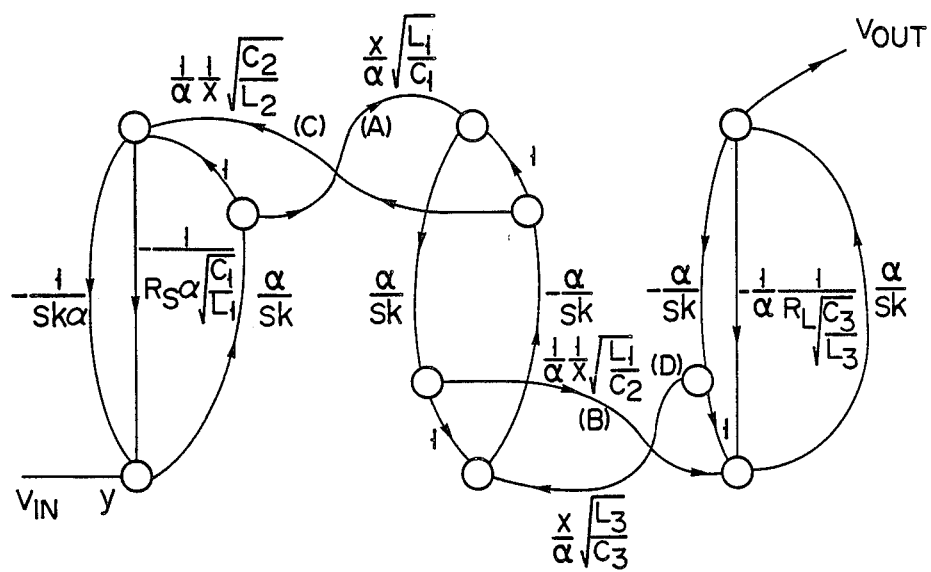
Figure 8:
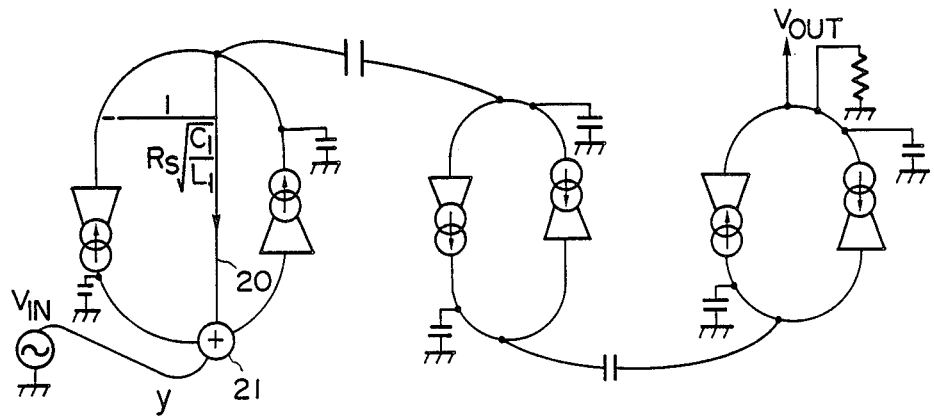
FIG. 8 is a circuit diagram for explaining the embodiment of the present invention.

When all absolute values of integrated values of branches 15 to 19 of FIG. 6 are equalized to ($\alpha/sk$), a signal flow graph as shown in FIG. 7 is obtained. FIG. 8 shows a circuit obtained in accordance with the signal flow graph of FIG. 7. However, since branch 20 of a termination resistor at the input side cannot be replaced with a resistor, adder 21 is required. In order to remove adder 21 and input a signal by capacitive coupling, branches are further moved. (In this case, however, if resistor $R_A$ is connected as shown in FIG. 26, this circuit does not strictly correspond to the signal flow graph of FIG. 7.)

The signal flow graph of FIG. 7 is rewritten as follows:

$$k \cdot \alpha = K_2, \ k/\alpha = K_1, \ R = R_S \cdot \alpha \sqrt{C_1/L_1} = R_L \cdot \alpha \sqrt{C_3/L_3} \quad (7)$$

$$(1/\alpha) \cdot (1/x) \sqrt{C_2/L_2} = (x/\alpha) \sqrt{L_1/C_1} \quad (8)$$
$$= (x/\alpha) \sqrt{L_3/C_3} =$$

Figure 9:
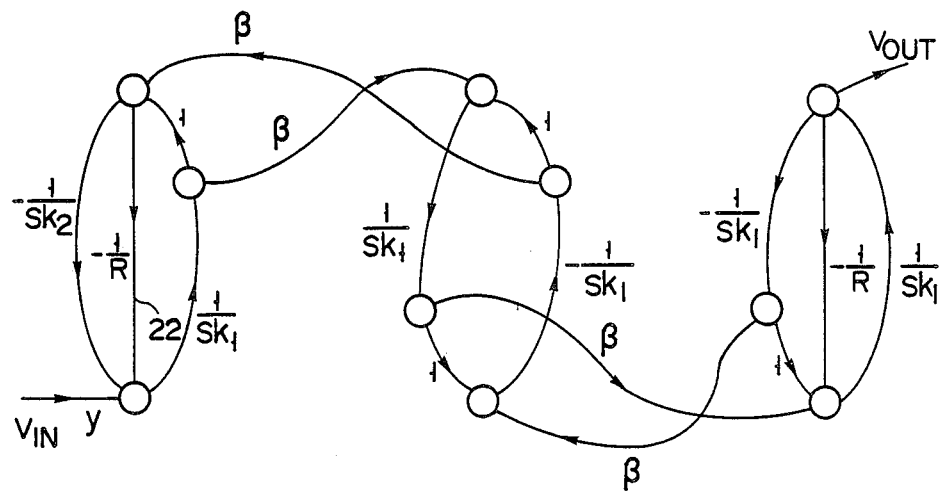
FIGS. 9 to 12 are signal flow graphs for explaining the embodiment of the present invention.

At this time, a signal flow graph is obtained as shown in FIG. 9.

Figure 10:
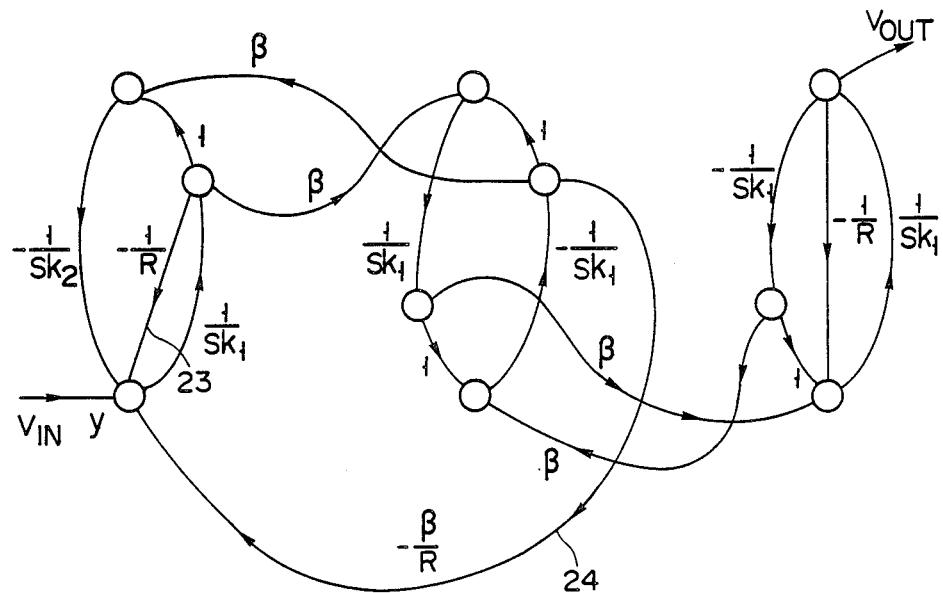
Figure 11:
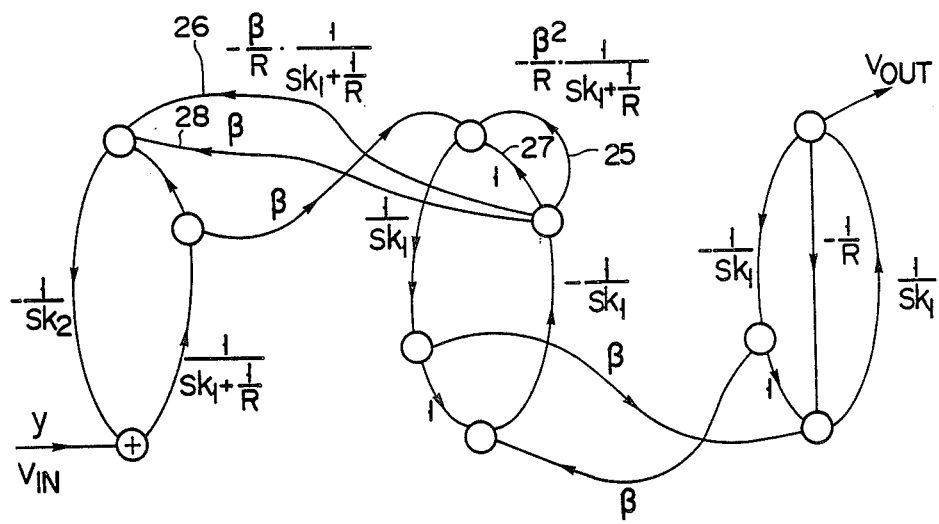
Figure 12:
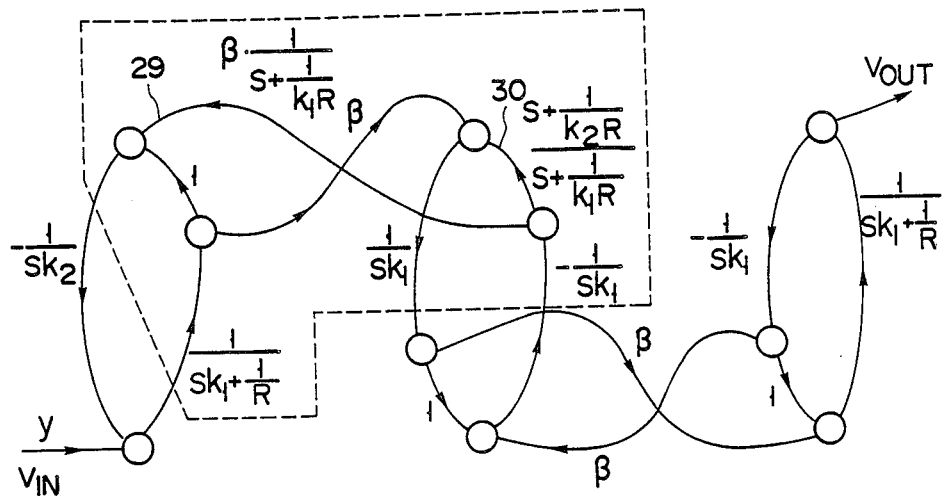

In this case, when branch 22 is moved as branch 23 in FIG. 10, branch 24 (transmittance: $-\beta/R$) is generated to compensate for an omitted signal. Then, branch 24 of FIG. 10 is divided into branches 25 and 26, and branches 26 and 25 are added to branches 28 and 27, respectively, as shown in FIG. 11. As a result, branches 29 and 30 shown in FIG. 12 are obtained. In this case, a sum of branches 26 and 28 can be easily calculated to be branch 29, but that of branches 25 and 27 cannot be easily calculated to be branch 30. Therefore, this calculation will be described in detail below.

In order to indicate that a sum of branches 25 and 27 is branch 30 $[\{s+(1/k_2R)\}/\{s+(1/k_1R)\}]$, an operation of band-pass transforming a tertiary low-pass filter shown in FIG. 13 will be described below. (In this case, assume that two capacitances are equal as in a Butterworth or Chebyshev filter.)

Figure 13:
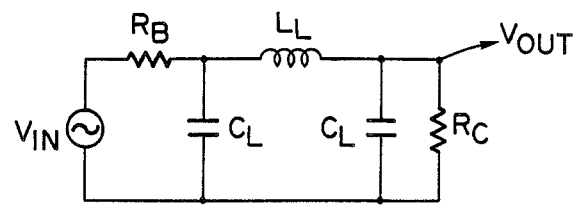
FIG. 13 is a circuit diagram of a tertiary low-pass filter.
Figure 14:
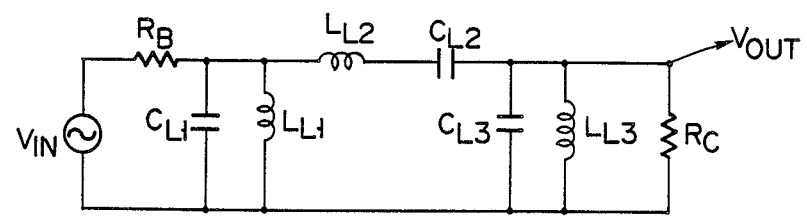
FIG. 14 is a circuit diagram of a sextic band-pass filter.

FIG. 14 shows a circuit obtained by band-pass transforming the circuit shown in FIG. 13.

In this case:
$C_{L1}=C_{L3}=C_L/b_\omega$, $C_{L2}=b_\omega/\omega_0 L_L$
$L_{L1}=L_{L3}=b_\omega/C_L\omega_0^2$, $L_{L2}=L_L/b_\omega$
($b_\omega$: a band width of a band-pass filter)
($\omega_0$: a center frequency of the band-pass filter)
Therefore:

$$\sqrt{C_{L1}/L_{L1}} = C_L\omega_0/b_\omega, \ \sqrt{L_{L2}/C_{L2}} = \omega_0 L_L/b_\omega$$

In this case, since $\alpha^2$ of FIG. 10 is $1+\sqrt{C_2/L_2}\sqrt{L_1/C_1}$, the following equation is obtained:

$$\alpha^2 = 1 + b_\omega^2/\omega_0^2 L_L C_L \quad (9)$$

In addition, since $x=\sqrt[4]{(C_2/L_2)\cdot(C_1/L_1)}$, a value of $\beta$ in FIG. 9 is obtained as follows:

$$\beta = (1/\alpha) \cdot (1/x)\sqrt{C_2/L_2} = (1/\alpha) \cdot (b_\omega/\omega_0)(1/\sqrt{L_L C_L})$$

Therefore:

$$\alpha\beta = (b_\omega/\omega_0)(1/\sqrt{L_L C_L})$$

From equations (9) and (10), the following equation is obtained:

$$\alpha^2 = 1 + \alpha^2\beta^2$$
$$\beta^2 = 1 - 1/\alpha^2 \quad (11)$$

Since $k_2=\alpha k$ and $k_1=k/\alpha$ from equation (7), $$\alpha^2 = k_2/k_1 \quad (12)$$

is obtained.

From equations (11) and (12), the following equation is obtained:

$$\beta^2 = 1 - k_1/k_2 \quad (13)$$

The sum of branches 25 and 27 is obtained as follows:

$$(1 - \beta^2/R) \cdot \{1/(sk_1 + 1/R)\}$$

When equation (13) is substituted for $\beta^2$:

$$1 - (1 - k_1/k_2)/(sk_1R + 1) = \quad (14)$$

$$(sk_1R + k_1/k_2)/(sk_1R + 1) = (s + 1/k_2R)/(s + 1/k_1R)$$

That is, branch 30 is obtained.

Then, the fact that the signal flow graph of FIG. 12 corresponds to a circuit of FIG. 1 will be described below. As described above, the circuit (FIG. 27) in which capacitors are coupled to form a $\pi$ circuit corresponds to the signal flow graph of FIG. 29. Therefore, the fact that a circuit (surrounded by a dotted line in FIG. 1) obtained by connecting a resistor to a capacitive $\pi$ circuit corresponds to a signal flow graph surrounded by a dotted line in FIG. 12 will be described below.

Figure 1:
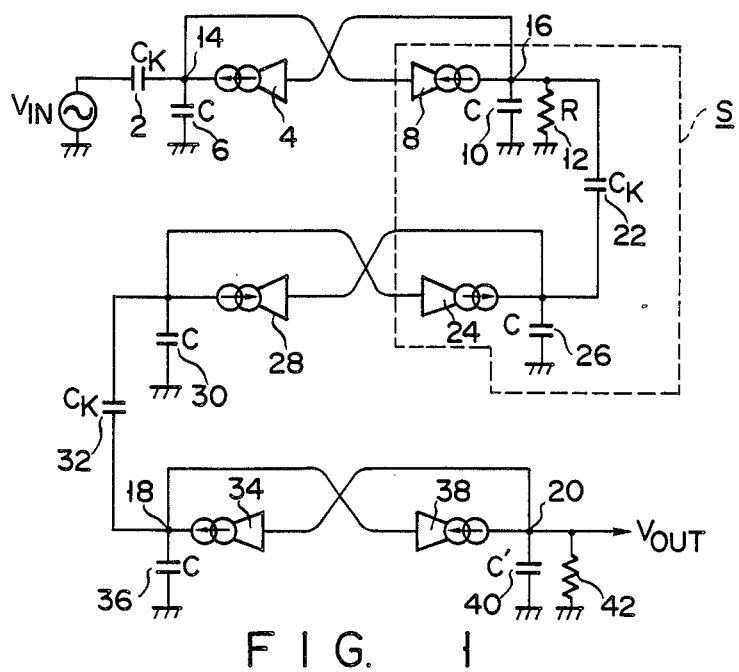
FIG. 1 is a circuit diagram of a band-pass filter according to an embodiment of the present invention.
Figure 15:
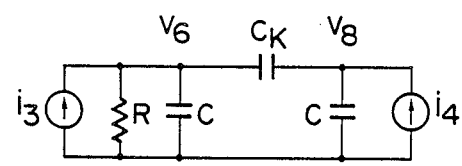
FIG. 15 is a circuit diagram for explaining the embodiment of the present invention.

FIG. 15 shows the circuit surrounded by dotted line S in FIG. 1. In FIG. 15, reference symbols i3 and i4 represent current sources.

In this case, the following equations can be obtained in accordance with the principle of superposition:

$$V_6 = i_3/[SC\{(C + 2C_k)/(C + C_k)\} + 1/R] + \quad (15)$$

$$[\{C_k/(C + C_k)\} \cdot i_4]/[SC\{(C + 2C_k)/(C + C_k)\} + 1/R]$$

$$V_8 = \quad (16)$$

$$[i_3 \times \{C_k/(C + C_K)\}]/[SC\{(C + 2C_k)/(C + C_k)\} + 1/R] +$$

$$[S(C + C_k) + 1/R]i_4 \div S(C + C_k)[SC\{(C +$$

$$2C_k)/(C + C_k)\} + 1/R]$$

Figure 27:
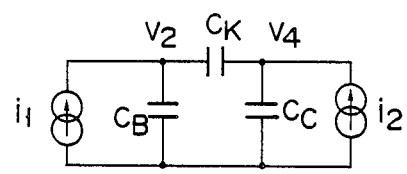
FIG. 27 is a circuit diagram for explaining the embodiment of the present invention.

In this case, if $k_2 = C + C_k$ is obtained from the following equations in the same manner as described when the signal flow graph of FIG. 29 is formed from FIG. 27, a perfect correspondence between FIGS. 12 and 1 can be obtained:

$$k_1 = C\{(C+2C_k)/(C+C_k)\}, \beta = C_k/(C+C_k$$

Since $\alpha^2 = 1/(1-\beta^2)$ is obtained from equation (11), $$=^2 = (C+C_k)^2/C(C+2C_k) \quad (17)$$

is obtained. Therefore, from equations (12) and (17), the following equation is obtained:

$$k_2/k_1 = (C+C_k)^2/C(C+2C_k)$$

A substitution of $k_1 = C\{(C+2C_k)/(C+C_k)\}$ into the above equation yields, $$k_2 = C\{(C + 2C_k)/(C + C_k)\} \cdot \{(C + C_k)^2/C(C + 2C_k)\}$$
$$= C + C_k$$

is obtained. That is, the perfect correspondence can be obtained between the circuit of FIG. 1 and the signal flow graph of FIG. 12. More specifically, transfer characteristics perfectly the same as those of the original circuit of FIG. 16 can be obtained in the circuit of FIG. 1 without approximation. FIG. 3 shows a circuit arrangement based on the circuit of FIG. 1. Results of this circuit are shown in FIG. 47.

Figure 2:
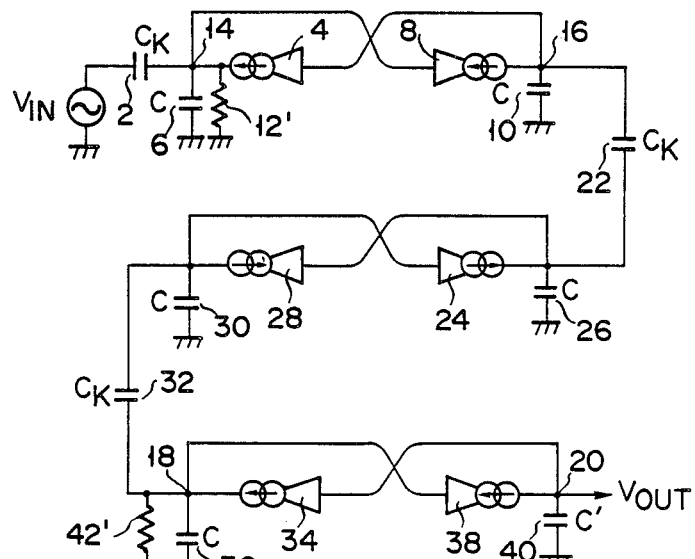
FIG. 2 is a circuit diagram of a modification of the embodiment in FIG. 1.
Figure 4:
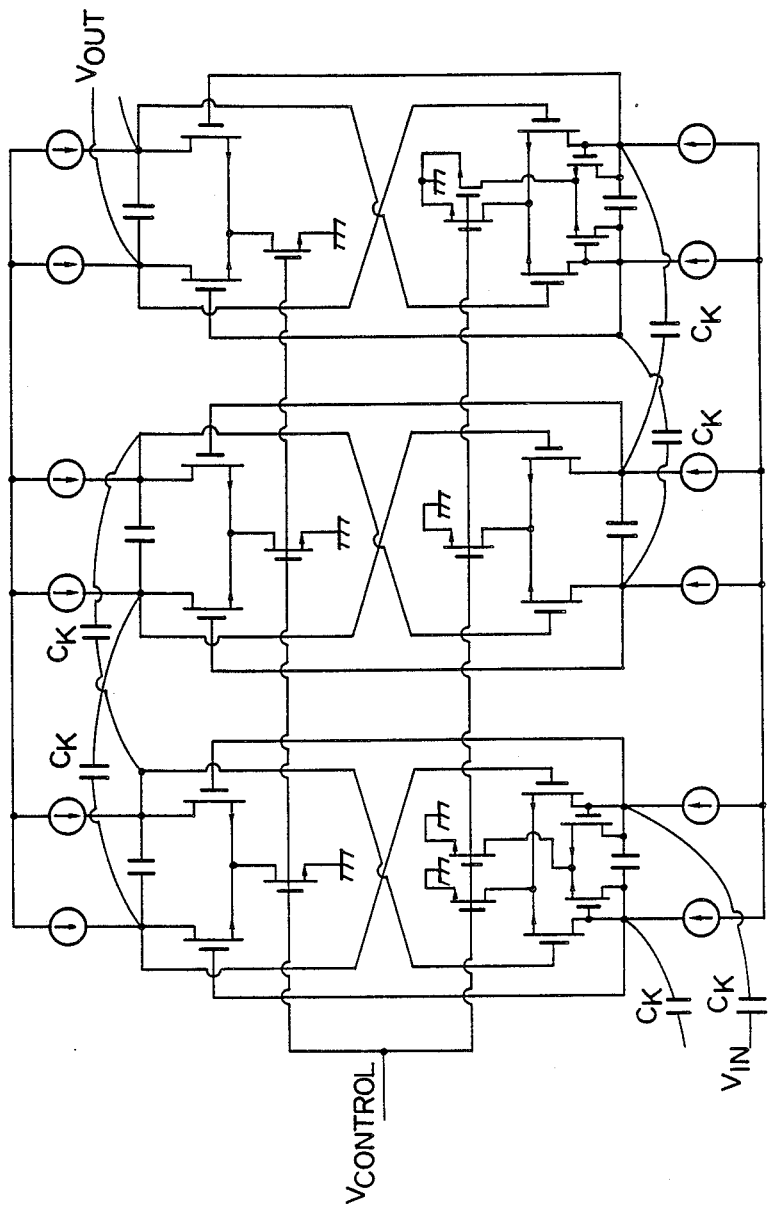
FIG. 4 is a detailed circuit diagram of the modification in FIG. 2.

Since the LC filter of FIG. 16 is symmetrical as a circuit, the same characteristics can be obtained when a signal input from an output terminal of the circuit shown in FIG. 1 is obtained from its input terminal. This is because the circuit of FIG. 1 is obtained by accurately modifying the original filter. The circuit is shown in FIG. 2. FIG. 4 shows a detailed arrangement of the circuit of FIG. 2.

The characteristics of this circuit (band-pass filter) can be summarized as follows.

(1) Any band-pass filter can be constituted by six equal voltage-controlled current sources and two capacitors C and $C_k$. Especially when the circuit is formed into an IC and a ratio between capacitances of C and $C_k$ is an integer ratio, relative accuracy of the capacitances can be greatly increased. Therefore, a filter can be constituted with high accuracy.

(2) Since the filter is constituted without approximation, band characteristics are perfectly the same as those of an original LC filter, and pass band characteristics are always flat.

(3) Element sensitivity is low because a ladder type LC filter is used as an original.

(4) In general, a circuit arrangement is complicated when a high-order band-pass filter is constituted by an active filter. However, since the circuit according to the present invention can be constituted by simply coupling of integrating circuits loops by capacitors, a circuit arrangement can be easily designed, and the number of elements can be reduced. In addition, since an adder and a buffer circuit are not used, a phase is not delayed, and variations on characteristics of the circuit are reduced. Furthermore, all signals can be easily differentially input/output. Therefore, a high-frequency operation can be advantageously performed.

In the above embodiment, the sextic filter is exemplified. However, it is obvious that the above theory can be applied to a filter of quartic or more to constitute a band-pass filter. A quartic band-pass filter will be described below.

By capacitive-coupling of integrating circuit loops in the same manner as described above, a quartic active band-pass filter can be constituted.

Figure 35:
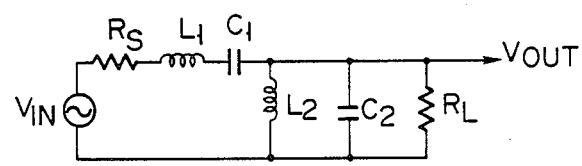
FIG. 35 is a circuit diagram for explaining the embodiment of FIG. 31.
Figure 36:
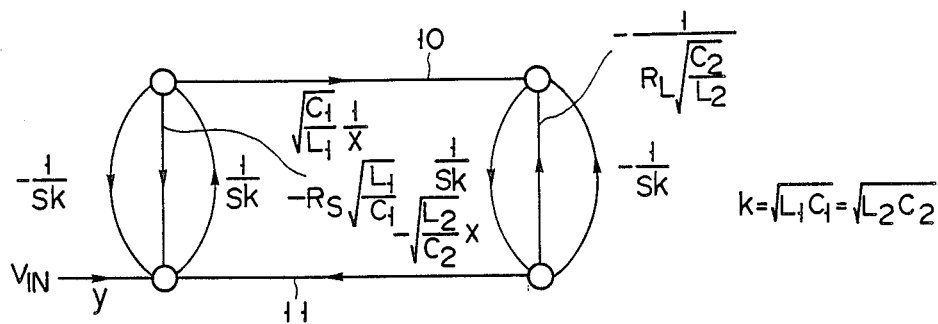
FIGS. 36 to 39 are signal flow graphs for explaining the embodiment of FIG. 31.

FIG. 36 is a signal flow graph obtained by transforming an LC filter of FIG. 35.

In FIG. 36, a value of x means that termination resistors Rs and RL are increased x times and scaling is performed. Then, branches 10 and 11 are equalized by changing x. In order to equalize branches 10 and 11, x is obtained as follows:

$$\sqrt{L_1/C_1} \cdot x = \sqrt{C_2/L_2} \cdot (1/x) \quad (18)$$

$$x = \sqrt[4]{(C_1/L_1) \cdot (C_2/L_2)}$$

Figure 37:
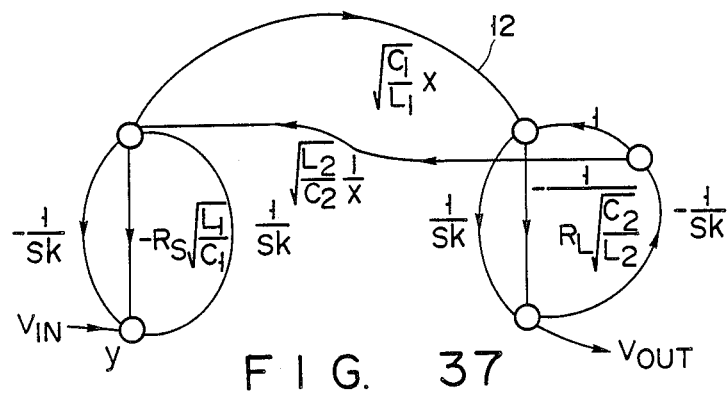
Figure 38:
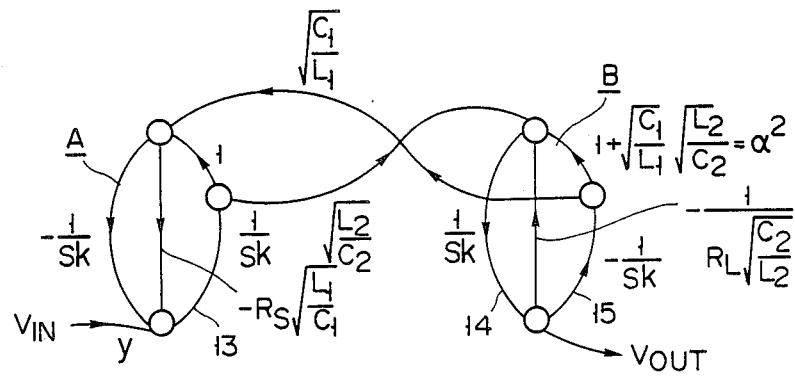

When branch 11 is moved without approximation, a bidirectional branch as in FIG. 37 is not obtained, but a branch of transmittance $\sqrt{C_2/L_2} \cdot (1/x)$ is generated from an intermediate portion of the branch. When branch 12 is moved to correspond to the signal flow graph of FIG. 29, a signal flow graph of FIG. 38 is obtained. This signal flow graph perfectly corresponds to the capacitive $\pi$ circuit (FIG. 27).

With this movement, however, a resonant frequency of loop B of two loops A and B of FIG. 38 is obtained as $\omega_0 \cdot \alpha$ ($\omega_0$: a center frequency of the band-pass filter).

In this case, the following equation is obtained:

$$\alpha^2 = 1 + \sqrt{C_2/L_2} \sqrt{L_1/C_2} = 1 + \sqrt{(L_3/C_3) \cdot (C_2/L_2)}$$

Figure 39:
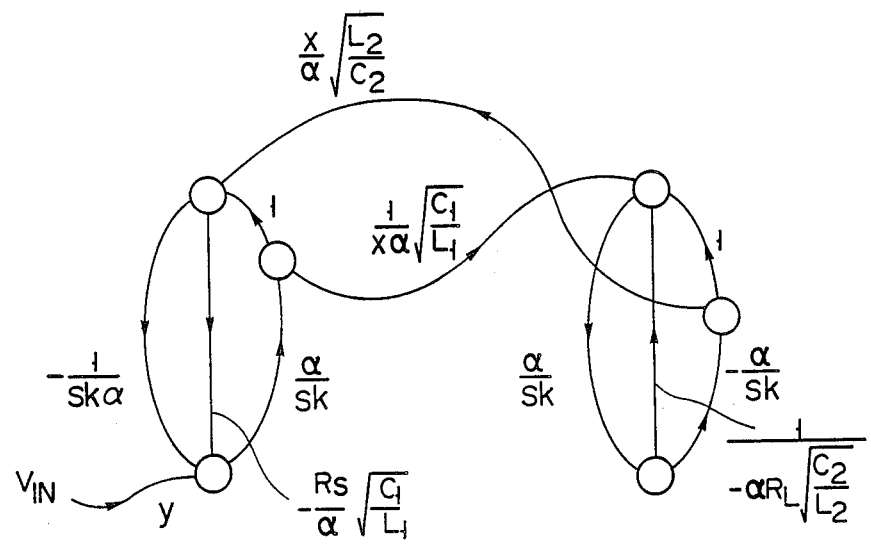
Figure 40:
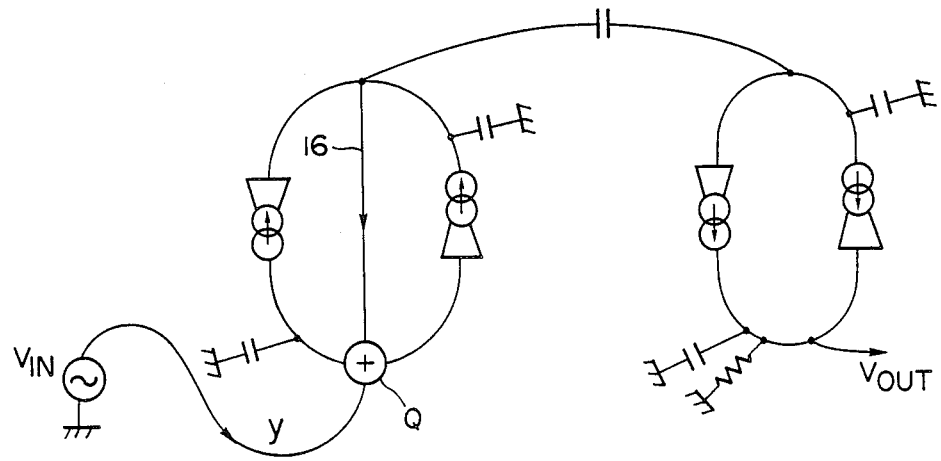
FIG. 40 is a circuit diagram for explaining the embodiment of FIG. 31.

When all absolute values of integrated values of branches 13 to 15 in FIG. 38 are equalized ($\alpha$/sk), FIG. 39 is obtained. FIG. 40 shows a detailed circuit arrangement based on FIG. 39.

However, since branch 16 cannot be replaced with a resistor, adder Q is required. In order to remove adder Q and input a signal by capacitive coupling, branches are further moved.

In the signal flow graph of FIG. 39, values are replaced as follows:

$$k \cdot \alpha = k_2, k/\alpha = k_1, R = Rs \cdot \alpha \sqrt{C_1/L_1} = R_L \cdot \alpha \sqrt{C_3/L_3} \quad (19)$$

$$(1/\alpha) \cdot (1/x) \cdot \sqrt{C_2/L_2} = (x/\alpha) \sqrt{(L_1/C_1)}$$
$$= (x/\alpha) \sqrt{L_3/C_3} = \beta$$

Figure 41:
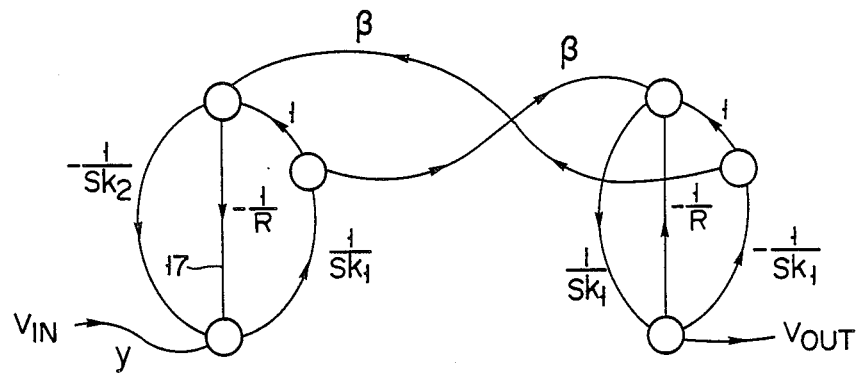
FIGS. 41 to 44 are signal flow graphs for explaining the embodiment of FIG. 31.

FIG. 41 is a signal flow graph obtained by rewriting the signal flow graph of FIG. 39.

Figure 42:
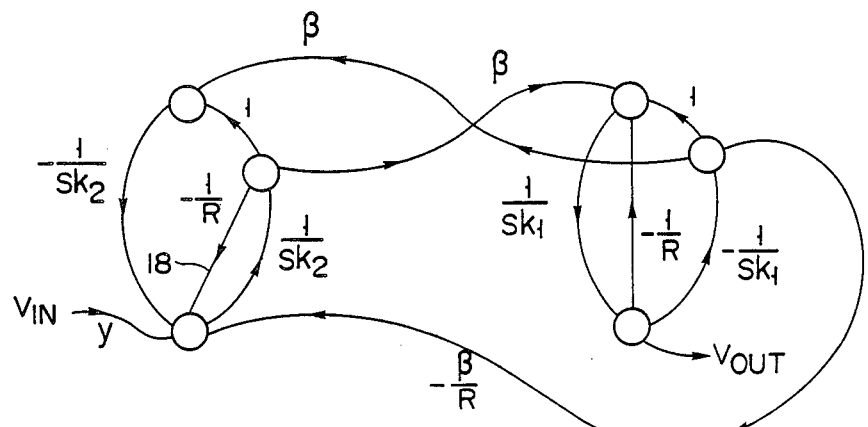
Figure 43:
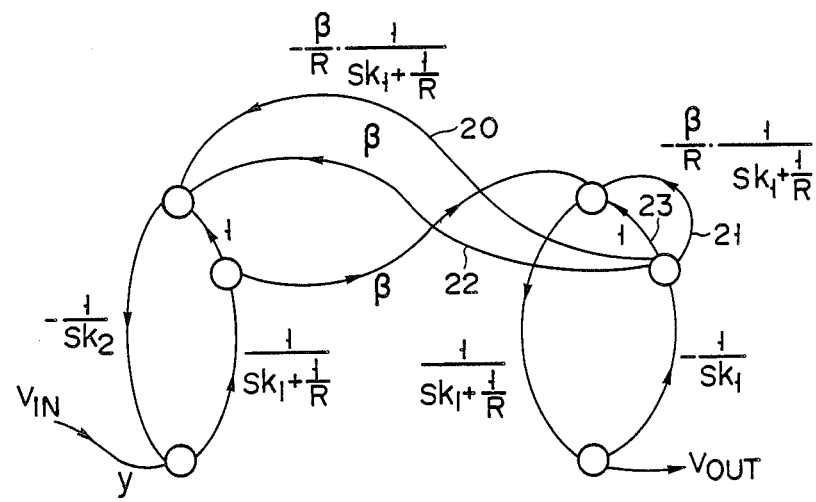
Figure 44:
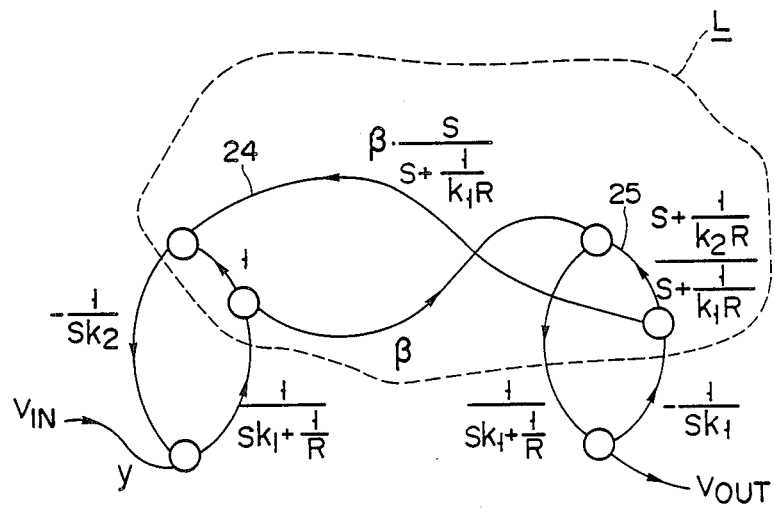

When branch 17 is moved as branch 18 of FIG. 42, branch 19 (transmittance: $-\beta/R$) is generated to compensate for a disappeared signal. Then, branch 19 is moved and divided into branches 20 and 21 as shown in FIG. 43, and branches 20 and 21 are added to branches 22 and 23, respectively. As a result, branches 24 and 25 shown in FIG. 44 are obtained.

In this case, a sum of branches 20 and 22 can be easily calculated to be branch 24, but that of branches 21 and 23 cannot be easily calculated to be branch 25. Calculation similar to that described above will be described below.

Figure 45:
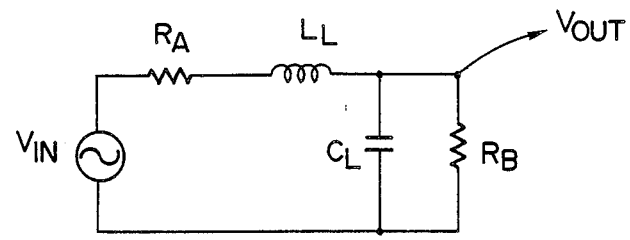
FIG. 45 is a circuit diagram of a secondary low-pass filter.
Figure 46:
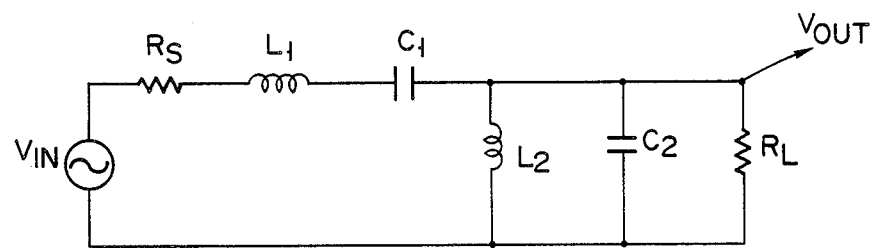
FIG. 46 is a circuit diagram of a quartic band-pass filter.

FIG. 45 shows a secondary low-pass filter circuit, and FIG. 46 shows a circuit obtained by band-pass transforming the circuit of FIG. 45.

In this case:
$L_1 = L_L/b_\omega$, $C_1 = L_L/\omega_0^2 L_L$,
$L_2 = b_\omega/C_L\omega_0^2$, $C_2 = C_L/b_\omega$
($b_\omega$: a band width of the band-pass filter)
($\omega_0$: a center frequency of the band-pass filter)
Therefore, $\sqrt{C_{L1}/L_{L1}} = b_\omega/\omega_0 L_L$ and $\sqrt{L_{L2}/C_{L2}} = b_\omega/C_L\omega_0$ are obtained. Since $\alpha^2$ of FIG. 38 is $1 + \sqrt{C_1/L_1} \cdot \sqrt{L_2/C_2}$, the following equation is obtained:

$$\alpha^2 = 1 + b_\omega^2/\omega_0^2 L_L C_L \quad (20)$$

In addition, since $x = \sqrt[4]{(C_2/L_2) \cdot (C_1/L_1)}$, a value of $\beta$ in FIG. 41 is obtained as follows:

$$\beta = (1/\alpha) \cdot (1/x) \sqrt{C_2/L_2} = (1/\alpha) \cdot (b_\omega/\omega_0) \cdot (1/\sqrt{L_L C_L})$$

Therefore, the following equation is obtained:

$$\alpha\beta = (b_\omega/\omega_0)(1/\sqrt{L_L C_L}) \quad (21)$$

From equations (20) and (21):

$$\alpha^2 = 1 + \alpha^2 \cdot \alpha^2 \quad (22)$$
$$\beta^2 = 1 - 1/\alpha^2$$

In addition, $$k_2 = \alpha k$$
$$k_1 = k/\alpha$$

are obtained from equation (19). Therefore, the following equation is obtained:

$$\alpha^2 = k_2/k_1 \quad (23)$$

A sum of branches 21 and 23 is obtained as follows:

$$1 - \beta^2/R \times 1/(sk_1 + 1/R)$$

When equation (24) is substituted for $\beta^2$, the following equation is obtained:

$$1 - (1 - k_1/k_2)/(sk_1 R + 1) = \quad (25)$$
$$(sk_1 R + k_1/k_2)/(sk_1 R + 1) = (S + 1/k_2 R)/(S + 1/k_1 R)$$

That is, branch 25 is obtained.

Figure 31:
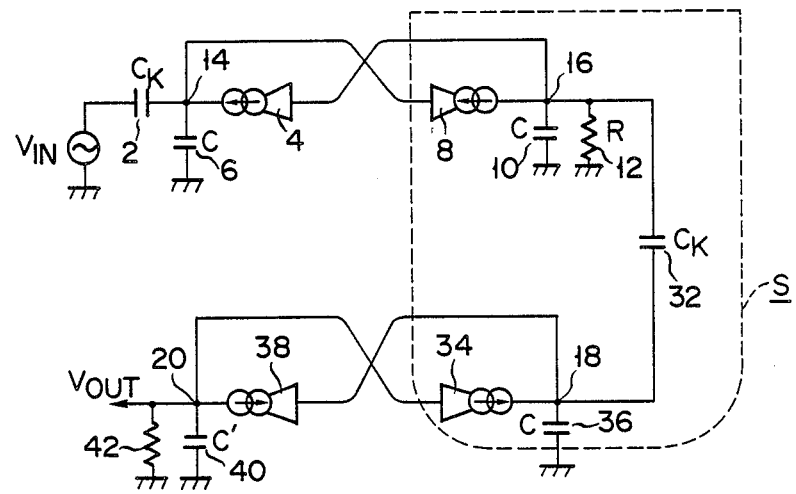
FIG. 31 is a circuit diagram of a band-pass filter according to another embodiment of the present invention.

Then, the fact that the signal flow graph of FIG. 44 corresponds to the circuit of FIG. 31 can be indicated through the same procedures as the signal flow graph of FIG. 1 can be obtained from that of FIG. 12 on the sextic band-pass filter. As a result, a perfect correspondence between FIGS. 31 and 44 can be obtained. Since the circuit of FIG. 31 is obtained without approximation, it has the same transfer characteristics as those of the original filter of FIG. 35. FIG. 33 shows a detailed arrangement of the circuit of FIG. 31.

Figure 32:
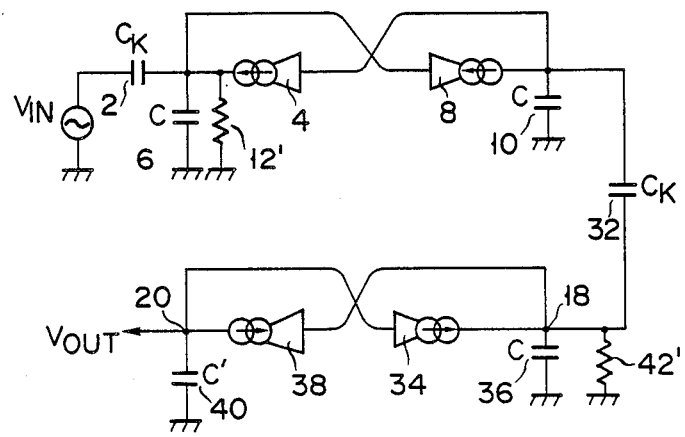
FIG. 32 is a circuit diagram of a modification of the embodiment in FIG. 31.
Figure 34:
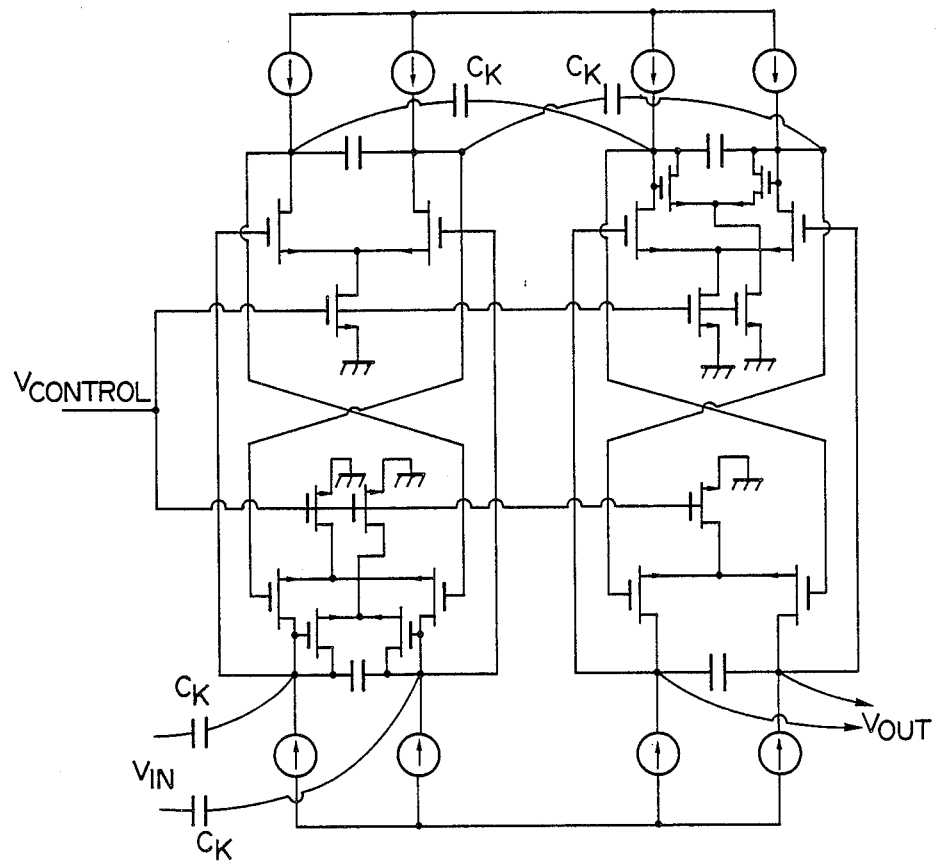
FIG. 34 is a detailed circuit diagram of the modification in FIG. 32.

When a signal input from an output terminal of the LC filter of FIG. 35 is obtained from its input terminal, the same characteristics can be obtained. Therefore, since the circuit of FIG. 31 is obtained by accurately modifying the original filter, the same characteristics can be obtained when a signal input from an output terminal of the circuit of FIG. 31 is obtained from its input terminal. This circuit is shown in FIG. 32, and a detailed arrangement of the circuit of FIG. 32 is shown in FIG. 34.

As described above, the sextic circuit (FIG. 1) can be realized by adding a set of arrangements (in which two integrating circuits each consisting of capacitor Ck and capacitor C connected to the output terminal of the voltage-controlled current source are connected so that an input terminal of one of the integrating circuits is connected to an output terminal of the other and an output terminal of one of the integrating circuits is connected to an input terminal of the other) between R and $C_k$ of S in the quartic circuit (FIG. 31). That is, an nth ($n \geq 4$) order circuit can be obtained by adding $(n-4)/2$ sets of above arrangements in the same manner.

What is claimed is:

1. A band-pass filter comprising:
a first integrating circuit pair including first and second integrating circuits, and first integrating circuit including a first current source connected to first and second nodes and a first integrating capacitor connected to said first node and a predetermined potential, said second integrating circuit including a second current source connected to said first and second nodes and a second integrating capacitor connected to said second node and the predetermined potential;

a second integrating circuit pair including third and fourth integrating circuits, said third integrating circuit including a third current source connected to third and fourth nodes and a third integrating capacitor connected to said third node and the predetermined potential, said fourth integrating circuit including a fourth current source connected to said third and fourth nodes and a fourth integrating capacitor connected to said fourth node and the predetermined potential;

a first coupling capacitor connected to said first node;

a second coupling capacitor connected between said second and third nodes;

a third coupling capacitor connected to said fourth node;

a first termination resistor connected between said first node and the predetermined potential; and a second termination resistor connected between said third node and the predetermined potential.

2. A filter according to claim 1, wherein said first to fourth current sources have substantially the same transconductors.

3. A filter according to claim 1, wherein each of said first to fourth current sources comprises a differential amplifier current, said first to fourth current sources are voltage-controlled and the predetermined potential is an vertical ground.

4. A filter according to claim 1, wherein said first to fourth integrating capacitors have substantially the same capacitances.

5. A filter according to claim 1, wherein said first and second Coupling capacitors have substantially the same capacitance.

6. A filter according to claim 1, wherein said filter is incorporated in an integrated circuit.

7. A filter according to claim 1, further comprising:

n intermediate circuits cascase-connected between said first integrating circuit pair and said second coupling capacitor, each of said n intermediate circuit comprising a coupling capacitor and an intermediate integrating circuit pair including first and second intermediate integrating circuits, said first intermediate integrating circuit including a first intermediate current source connected to first and second intermediate nodes and a first intermediate integrating capacitor connected to said first intermediate node and the predetermined potential, said second intermediate integrating circuit including a second intermediate current source connected to said first and second intermediate nodes and a second intermediate integrating capacitor connected to said second intermediate node and the predetermined potential, said coupling capacitor being connected to said first intermediate node, said coupling capacitor of a first intermediate circuit of said n intermediate circuits being connected to said second node, and said second intermediate node of a last intermediate circuit of said n intermediate circuits being connected to said second coupling capacitor.

8. A filter according to claim 7, wherein said first to fourth current sources and said first and second intermediate current sources of each of said n intermediate circuits have substantially the same transconductors, and said first to fourth integrating capacitors and said first and second intermediate integrating capacitors of each of said n intermediate circuits have substantially the same capacitances.

9. A filter according to claim 7, wherein said first to fourth current sources and said first and second intermediate current sources of each of said n intermediate circuits comprise voltage-controlled differential amplifier circuits, and the predetermined potential is an virtual ground.

10. A filter according to claim 7, wherein said filter is incorporated in an integrated circuit.

11. A band-pass filter comprising:

a first integrating circuit pair including first and second integrating circuits, said first integrating circuit including a first current source connected to first and second nodes and a first integrating capacitor connected to said first node and a predetermined potential, said second integrating circuit including a second current source connected to said first and second nodes and a second integrating capacitor connected to said second node and the predetermined potential;

a second integrating circuit pair including third and fourth integrating circuits, said third integrating circuit including a third current source connected to third and fourth nodes and a third integrating capacitor connected to said third node and the predetermined potential, said fourth integrating circuit including a fourth current source connected to said third and fourth nodes and a fourth integrating capacitor connected to said fourth node and the predetermined potential;

a first coupling capacitor connected to said first node;

a second coupling capacitor connected between said second and third node;

a third coupling capacitor connected to said fourth node;

a first termination resistor connected between said second node and the predetermined potential;

a second termination resistor connected between said fourth node and the predetermined potential.

12. A filter according to claim 11 wherein said first to fourth current sources have substantially the same transconductors.

13. A filter according to claim 11, wherein each of said first to fourth current sources comprises a differential amplifier circuit, said first to fourth current sources are voltage-controlled and the predetermined potential is an virtual ground.

14. A filter according to claim 11, wherein said first to fourth integrating capacitors have substantially the same capacitance.

15. A filter according to claim 11, wherein said first and second coupling capacitors have substantially the same capacitance.

16. A filter according to claim 11, wherein said filter is incorporated in an integrated circuit.

17. A filter according to claim 11, further comprising:

n intermediate circuits cascade-connected between said first integrating circuit pair and said second coupling capacitor, each of said n intermediate circuits comprising a coupling capacitor and an intermediate integrating circuit pair including first and second intermediate integrating circuits, said first intermediate integrating circuits including a first intermediate current source connected to first and second intermediate nodes and a first intermediate integrating capacitor connected to said first intermediate node and the predetermined potential, said second intermediate integrating circuit including a second intermediate current source connected to said first and second intermediate nodes and a second intermediate integrating capacitor connected to said second intermediate node and the predetermined potential, said coupling capacitor being connected to said first intermediate node, said coupling capacitor of a first intermediate circuit of said n intermediate circuits being connected to said second node, and said second intermediate node or a last intermediate circuit of said n intermediate circuits being connected to said second coupling together.

18. A filter according to claim 17, wherein said first to fourth current sources and said first and second intermediate current sources of each of said n intermediate circuits have substantially the same transconductors, and said first to fourth integrating capacitors and said first and second intermediate integrating capacitors of each of said n intermediate circuits have substantially the same capacitances.

19. A filter according to claim 17, wherein said first to fourth current sources and said first and second intermediate current sources of each of said n intermediate circuits comprise voltage-controlled differential amplifier currents and the predetermined potential is an virtual ground.

20. A filter according to claim 17, wherein said filter is incorporated in an integrated circuit.

* * * * *